(12) United States Patent
Humenik et al.

(10) Patent No.: US 8,232,636 B2
(45) Date of Patent: Jul. 31, 2012

(54) RELIABILITY ENHANCEMENT OF METAL THERMAL INTERFACE

(75) Inventors: James N Humenik, Hopewell Junction, NY (US); Sushumna Iruvanti, Hopewell Junction, NY (US); Richard Langlois, Granby (CA); Hsichang Liu, Hopewell Junction, NY (US); Govindarajan Natarajan, Hopewell Junction, NY (US); Kamal K Sikka, Hopewell Junction, NY (US); Hilton T Toy, Hopewell Junction, NY (US); Jiantao Zheng, Hopewell Junction, NY (US); Gregg B Monjeau, Hopewell Junction, NY (US); Mark Kapfhammer, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 12/693,646

(22) Filed: Jan. 26, 2010

(65) Prior Publication Data
US 2011/0180923 A1 Jul. 28, 2011

(51) Int. Cl.
*H01L 23/10* (2006.01)
*H01L 23/34* (2006.01)
(52) U.S. Cl. .................. 257/707; 257/706; 438/122
(58) Field of Classification Search ........... 257/706, 257/707, 704, 782, 783; 438/118, 122, 125
See application file for complete search history.

(56) References Cited

U.S. PATENT DOCUMENTS

| | | | |
|---|---|---|---|
| 4,034,068 A | 7/1977 | Aramaki et al. | |
| 4,323,914 A | 4/1982 | Berndlmaier et al. | |
| 4,654,966 A | 4/1987 | Kohara et al. | |
| 5,325,265 A | 6/1994 | Turlik et al. | |
| 5,396,403 A | 3/1995 | Patel | |
| 5,909,056 A * | 6/1999 | Mertol | 257/704 |
| 5,915,167 A | 6/1999 | Leedy | |
| 6,133,640 A | 10/2000 | Leedy | |
| 6,208,545 B1 | 3/2001 | Leedy | |
| 6,551,857 B2 | 4/2003 | Leedy | |
| 6,563,224 B2 | 5/2003 | Leedy | |
| 6,632,706 B1 | 10/2003 | Leedy | |

(Continued)

FOREIGN PATENT DOCUMENTS

CN 1525485 4/1998

(Continued)

OTHER PUBLICATIONS

International Search Report Dated May 16, 2011.

(Continued)

*Primary Examiner* — S. V. Clark
(74) *Attorney, Agent, or Firm* — Joseph Petrokaitis

(57) ABSTRACT

A frontside of a chip is bonded to a top surface of a chip carrier. Seal material is dispensed at a periphery of the top surface of the chip carrier. A solder TIM having a first side and a second side is provided. The first side of the TIM contacts a backside of the chip. A reflow is performed to melt the TIM. The second side of the TIM is bonded to a lid. The seal material is cured. The lid is attached to the top surface of the chip carrier. Backfill material is injected into a space between the top surface of the chip carrier and the lid. The backfill material abuts sides of the TIM. The backfill material is cured. TIM solder cracking and associated thermal degradation are mitigated.

24 Claims, 5 Drawing Sheets

U.S. PATENT DOCUMENTS

| | | | |
|---|---|---|---|
| 6,724,978 B2 | 4/2004 | Van Gestel et al. | |
| 6,891,259 B2 * | 5/2005 | Im et al. | 257/687 |
| 7,138,295 B2 | 11/2006 | Leedy | |
| 7,193,239 B2 | 3/2007 | Leedy | |
| 7,218,000 B2 | 5/2007 | Houle | |
| 7,268,428 B2 * | 9/2007 | Edwards et al. | 257/712 |
| 7,271,479 B2 * | 9/2007 | Zhao et al. | 257/704 |
| 7,312,527 B2 | 12/2007 | Sane et al. | |
| 7,474,004 B2 | 1/2009 | Leedy | |
| 7,504,732 B2 | 3/2009 | Leedy | |
| 7,705,466 B2 | 4/2010 | Leedy | |
| 7,719,110 B2 * | 5/2010 | Zhao et al. | 257/707 |
| 7,795,724 B2 * | 9/2010 | Brodsky et al. | 257/712 |
| 2002/0132465 A1 | 9/2002 | Leedy | |
| 2003/0146520 A1 | 8/2003 | Fang | |
| 2003/0173608 A1 | 9/2003 | Leedy | |
| 2003/0183909 A1 | 10/2003 | Chiu | |
| 2004/0036183 A1 | 2/2004 | Im et al. | |
| 2006/0118925 A1 | 6/2006 | Macris et al. | |
| 2008/0006915 A1 | 1/2008 | Nakamura et al. | |
| 2008/0093733 A1 | 4/2008 | Hsu | |
| 2009/0067210 A1 | 3/2009 | Leedy | |
| 2009/0127700 A1 | 5/2009 | Romig | |
| 2009/0174082 A1 | 7/2009 | Leedy | |
| 2009/0175104 A1 | 7/2009 | Leedy | |
| 2009/0218700 A1 | 9/2009 | Leedy | |
| 2009/0219742 A1 | 9/2009 | Leedy | |
| 2009/0219743 A1 | 9/2009 | Leedy | |
| 2009/0219744 A1 | 9/2009 | Leedy | |
| 2009/0219772 A1 | 9/2009 | Leedy | |
| 2009/0230501 A1 | 9/2009 | Leedy | |
| 2010/0171224 A1 | 7/2010 | Leedy | |
| 2010/0171225 A1 | 7/2010 | Leedy | |
| 2010/0172197 A1 | 7/2010 | Leedy | |
| 2010/0173453 A1 | 7/2010 | Leedy | |

FOREIGN PATENT DOCUMENTS

| | | |
|---|---|---|
| CN | 101188235 | 4/1998 |
| CN | 98803836 | 6/2004 |
| EP | 0975472 | 4/1998 |
| EP | 1986233 | 4/1998 |
| JP | 60 257156 | 12/1985 |
| JP | 10-543031 | 4/1998 |
| JP | 2008028407 | 8/2007 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

OTHER PUBLICATIONS

"Cooling Structure for an Integrated Circuit Module", IBM Technical Disclosure Bulletin, International Business Machines Corporation, vol. 23, No. 2, Jul. 1, 1980, p. 602, XP002031892, ISSN: 0018-8689.

* cited by examiner

RELIABILITY ENHANCEMENT OF METAL THERMAL INTERFACE

BACKGROUND OF THE INVENTION

The present invention relates to microelectronic circuit fabrication and structure, and more particularly, to improving the reliability of solid-solder based cooling schemes used in electronic packages.

Solder thermal interface may be used between a processor chip and a heat spreader to effectively remove heat from the processor. Typically, the processor chip is silicon and the heat spreader is Ni-plated copper, an alloy or a composite. However, the relatively rigid solder thermal interface compared to a polymeric TIM or grease, even with the use of softer metals such as indium or its alloys, is prone to cracking in thermal or power cycling due to thermomechanical stresses generated by the coefficient of thermal expansion (CTE) mismatch between the heat-spreader and the silicon chip. The CTE mismatch is exacerbated with a copper heat-spreader which is often used due to cost and thermal conductivity advantages. The dynamic warp of the chip-carrier is another contributor to the propensity for solder TIM cracking and/or thermal degradation in organic, laminate chip-carrier packages. The cracked solder interface results in thermal degradation and an increase in processor operating temperature or a reduction in reliability.

An increase in thermal interface material (TIM) thickness may reduce strain in the TIM and consequently may mitigate the thermal cycling related solder TIM cracking. An increase in TIM bondline may decrease the thermal performance. It is preferable to use a thinner bondline to obtain good thermal performance. Also, due to the dynamic warp associated with laminate chip-carriers, organic packages with solder thermal interface are susceptible to TIM cracking and associated thermal performance deterioration in the field. The proclivity for solder cracking may increase as the die size increases.

A liquid metal TIM may be used to benefit from the higher thermal conductivity of a metal TIM, while eliminating the fatigue cracking related degradation of a solid metal TIM (solder). Liquid metal cooling schemes may benefit from the high thermal conductivity of liquid metal alloys. However, the liquid metal cooling requires containment schemes to prevent the material from leaving the interface and shorting exposed components adjacent to the die or on the board. Oxidation and corrosion barriers may be required to protect the liquid metal TIM from degrading and impacting thermal performance or reliability.

For applications involving large chips, high chip-powers, multi-core chips with non-uniform power distribution and hot spots, or devices requiring more power cycles to accommodate power management applications, a high thermal performance, reliable thermal interface solution is needed.

SUMMARY OF THE INVENTION

In a first aspect of the invention, a method of forming an electronic package includes providing a chip having a frontside and a backside. The method includes providing a chip carrier having a top surface and a bottom surface. The method includes bonding the frontside of the chip to the top surface of the chip carrier. The method includes dispensing a seal material at a periphery of the top surface of the chip carrier. The method includes providing a lid. The method includes providing a solder TIM having a first side and a second side, wherein the first side of the TIM contacts the backside of the chip and the second side of the TIM contacts the lid. The method includes performing a reflow to melt the TIM, wherein the first side of the TIM is bonded to the backside of the chip and the second side of the TIM is bonded to the lid. The method includes curing the seal material, wherein the lid is attached to the top surface of the chip carrier. The method further includes injecting backfill material into a space between the top surface of the chip carrier and the lid, wherein the backfill material abuts sides of the TIM and fills the space. The method also includes curing the backfill material.

In a further aspect of the invention, a method of forming an electronic package includes providing a chip having a frontside and a backside. The method includes providing a chip carrier having a top surface and a bottom surface. The method includes bonding the frontside of the chip to the top surface of the chip carrier. The method includes dispensing a seal material at a periphery of the top surface of the chip carrier. The method includes providing a lid having at least one fill hole and at least one vent hole. The method includes providing a TIM having a first side and a second side, wherein the first side of the TIM contacts the backside of the chip and the second side of the TIM contacts the lid. The method includes performing a solder reflow to melt the TIM, wherein the first side of the TIM is bonded to the chip and the second side of the TIM is bonded to the lid. The method further includes injecting backfill material through the fill hole and the vent hole, wherein the backfill material abuts sides of the TIM and fills a cavity between the chip carrier and the lid. The method also includes curing the seal material and the backfill material simultaneously, wherein the lid is bonded to the top surface of the chip carrier.

In a yet further aspect of the invention, an electronic package includes a chip having a frontside and a backside. The electronic package includes a chip carrier having a top surface and a bottom surface, wherein the frontside of the chip is bonded to the top surface of the chip carrier. The electronic package includes a lid. The electronic package further includes a TIM having a first side and a second side, wherein the first side of the TIM is in contact with the backside of the chip, the second side of the TIM is bonded to the lid and the lid is attached to the top surface of the chip carrier at a periphery with a seal. The electronic package also includes backfill material in a space between the top surface of the chip carrier and the lid, wherein the backfill material abuts sides of the TIM.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

The present invention generally relates to enhancing the reliability of an electronic package cooled with a solder thermal interface material (TIM). In embodiments, the invention provides a structure and method including a backfill material to mitigate TIM solder cracking and associated thermal degradation. In more specific embodiments, the backfill material may be a polymeric resin.

Figure 1A:
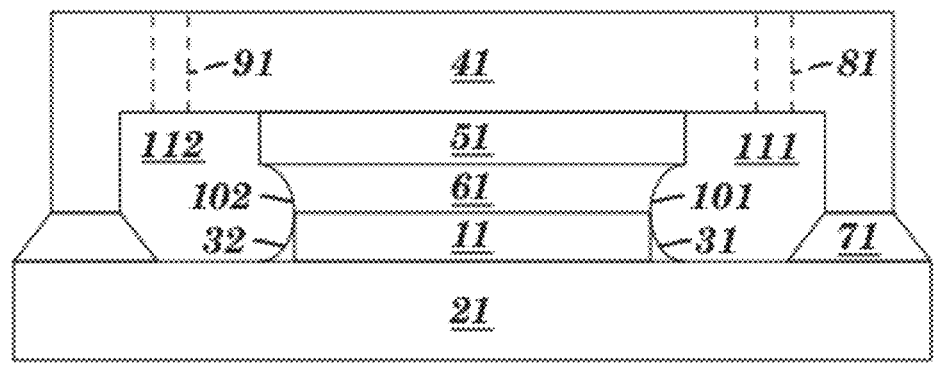
FIGS. 1A-1B show a cross-sectional views of an electronic package in accordance with embodiments of the invention.

Referring to FIG. 1A, an electronic package 10 comprises a semiconductor device or chip 11 bonded to a chip carrier 21. Chip 11 may be a single chip or multichips. A frontside of chip 11 may be flip chip bonded through C4 bumps (not shown) to a top surface of chip carrier 21 and underfilled with an underfill material using conventional processes known in the art. The underfill material may be cured with fillets 31, 32. A lid 41 may be bonded to a backside of chip 11 through a solder thermal interface material (TIM) 61. Lid 41 may be bonded at the periphery to the top surface of chip carrier 21 with a polymeric seal 71. Lid 41 may include fill and vent holes 81, 91.

In an embodiment of the invention, the backside of chip 11 may be metallized for an intimate metallurgical bond with a first side of TIM 61. TIM 61 may be bonded on a second side to lid 41. The second side of TIM 61 may also be bonded to a pedestal 51 on lid 41. The metallization on the backside of chip 11 may include a multilayer stack of Cr/Ni/Au. Alternatively, the metallization may include a stack of Ti/NiV/Au. TIM 61 may be In, In—Ag alloy, In—Sn alloy, Bi or its alloys, Sn—Ag—Cu (SAC) lead-free solder or other high thermal conductivity material. Preferably, TIM 61 is In or its alloys. More preferably, TIM 61 is In. Preferably, TIM 61 has a thickness of about 1 mil to 20 mil. More preferably, TIM 61 has a thickness from 4 mil to 12 mil. Lid 41 may be bonded at the periphery to a top surface of chip carrier 21 with polymeric seal 71. Polymeric seal 71 may be a silicone elastomer adhesive, an epoxy adhesive, a modified epoxy or a modified silicone adhesive. Chip carrier 21 may be an organic laminate or a multi-layer ceramic substrate. The space between chip carrier 21 and lid 41 may be filled with a backfill material 111, 112, such as a resin, through fill and vent holes 81, 91.

Figure 3A:
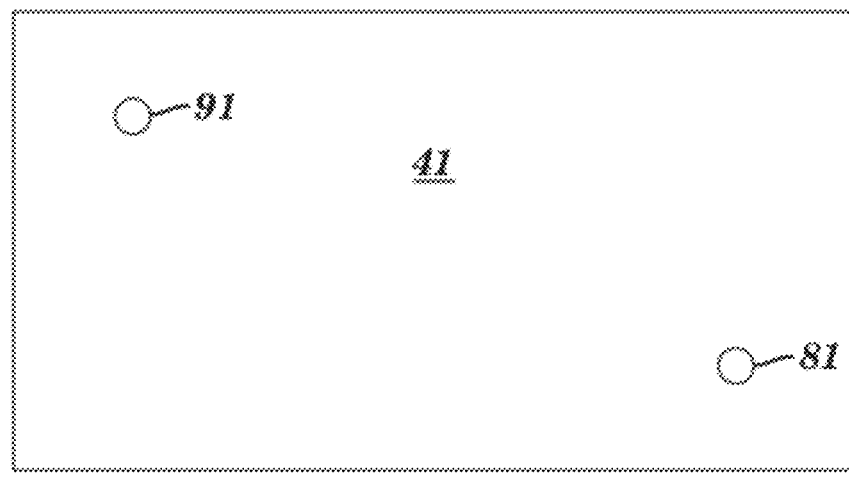
FIGS. 3A-3C show top views of an electronic package lid in accordance with embodiments of the invention.
Figure 1B:
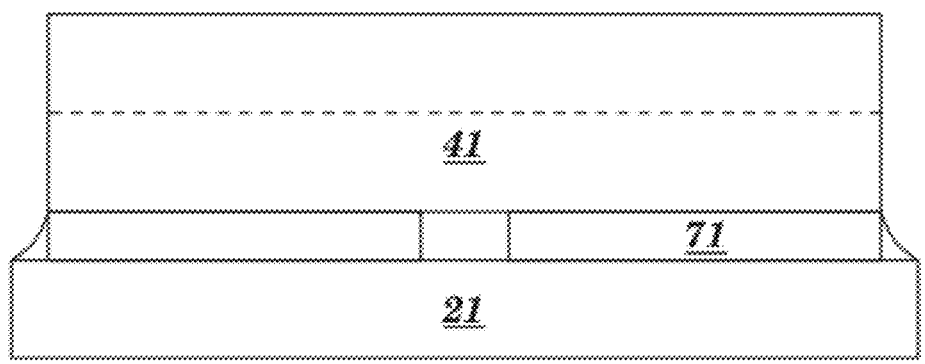
Figure 3B:
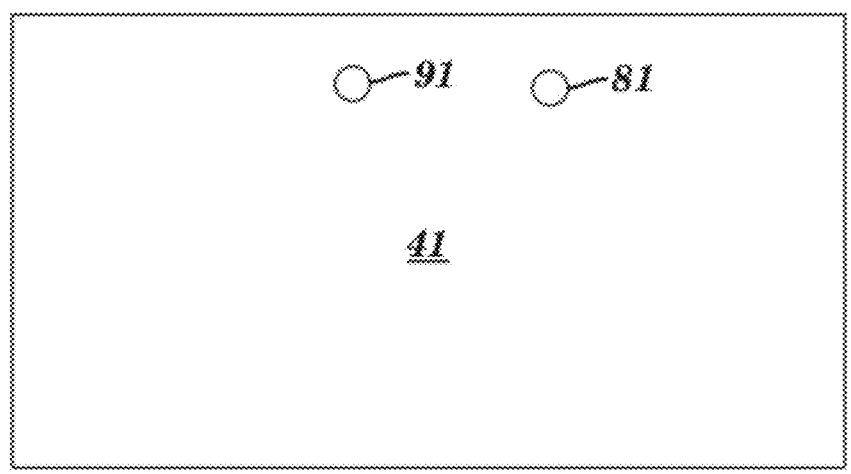
Figure 3C:
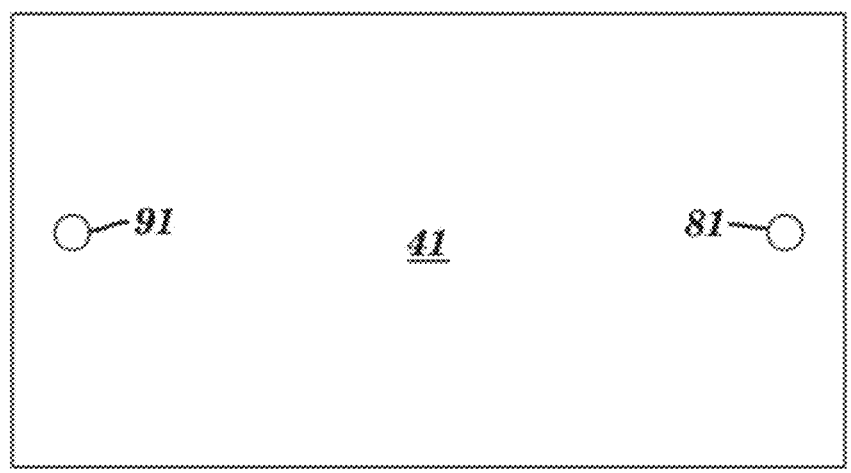

Referring to FIG. 3A, fill and vent holes 81, 91 of lid 41 may be diagonally across from each other. Alternatively, fill and vent holes 81, 91 may be adjacent to each other as shown in FIG. 3B. Fill and vent holes 81, 91 may also be on opposite sides as shown in FIG. 3C Referring to FIG. 1B, backfill material 111,112 may also be introduced through a gap in polymeric seal 71. Backfill material 111, 112 may be an epoxy or a modified epoxy, a modified silicone or a polyimide with a modulus of elasticity in the range of about 1 GPa to 20 GPa. More preferably, backfill material 111, 112 is an epoxy with a modulus in the range of 3 GPa to 15 GPa. Even more preferable backfill material 111, 112 is an epoxy with a modulus in the range of 5 GPa to 10 GPa.

Figure 2:
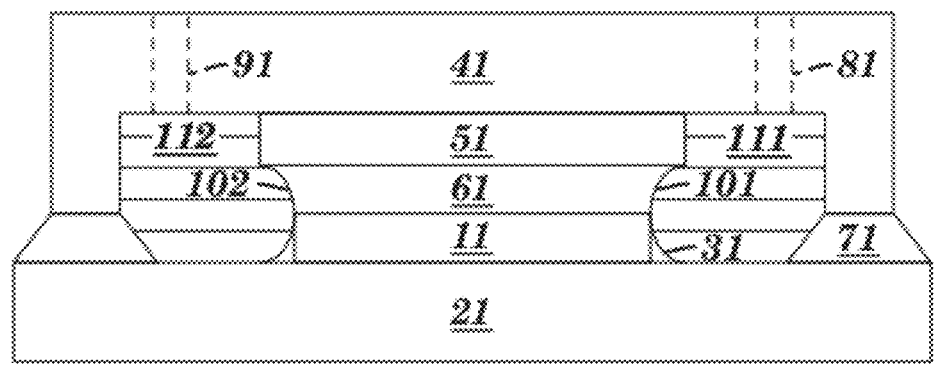
FIG. 2 shows a cross-sectional view of an electronic package after being filled with a backfill material in accordance with an embodiment of the invention.

Referring to FIGS. 1A and 2, a method of forming an electronic package according to an embodiment of the invention will now be described. A frontside of semiconductor chip 11 may be bonded to a top surface of chip carrier 21 through C4 bumps (not shown). The space between chip 11 and laminate chip carrier 21 and in between the C4 bumps may be underfilled with conventional underfill materials and processes. The underfill material may be cured with fillets 31, 32 along the chip periphery. This sub-assembly of chip joined carrier may be placed in a fixture. Polymeric seal material 71 may dispensed at a periphery of the top surface of laminate chip carrier 21. Solder TIM 61 may be pre-attached to lid 41. Lid 41 may be positioned such that a first side of solder TIM 61 makes contact with a backside of metallized chip 11. A nominal load may be applied to lid 41 in the fixture to assure TIM 61 contacts chip 11 during TIM reflow. The assembly may be subjected to a solder reflow profile to melt TIM 61 and make a metallurgical bond between TIM 61 and the backside of chip 11. Simultaneously, polymeric seal material 71 may be set up to bond lid 41 to chip carrier 21. Subsequently, the assembly may be subjected to another heat cycle to complete the polymeric seal cure. At the end of this process, lid 41 is attached to the backside of chip 11 with solder TIM 61 and the periphery of lid 41 is attached to chip carrier 21 as shown in FIG. 1. Subsequently, backfill resin 111,112 may be introduced into the space between lid 41 and chip carrier 21 through fill and vent holes 81, 91. Backfill resin 111, 112 abuts the sides of underfill fillets 31, 32 and TIM solder fillets 101, 102 and may fill the cavity between the top-side of the chip carrier and the lid. Backfill resin 111,112 may be cured in another heat cycle.

In an alternative process, after solder TIM 61 is reflowed and bonded to chip 11, the space between lid 41 and chip carrier 21 may be filled with backfill resin 111, 112. Polymeric seal 71 and backfill resin 111, 112 may be cured simultaneously. The cured backfill resin 111, 112 abutting solder TIM 61 and bonding laminate chip carrier 21 to lid 41 mitigates TIM solder cracking and associated thermal degradation.

Figure 4A:
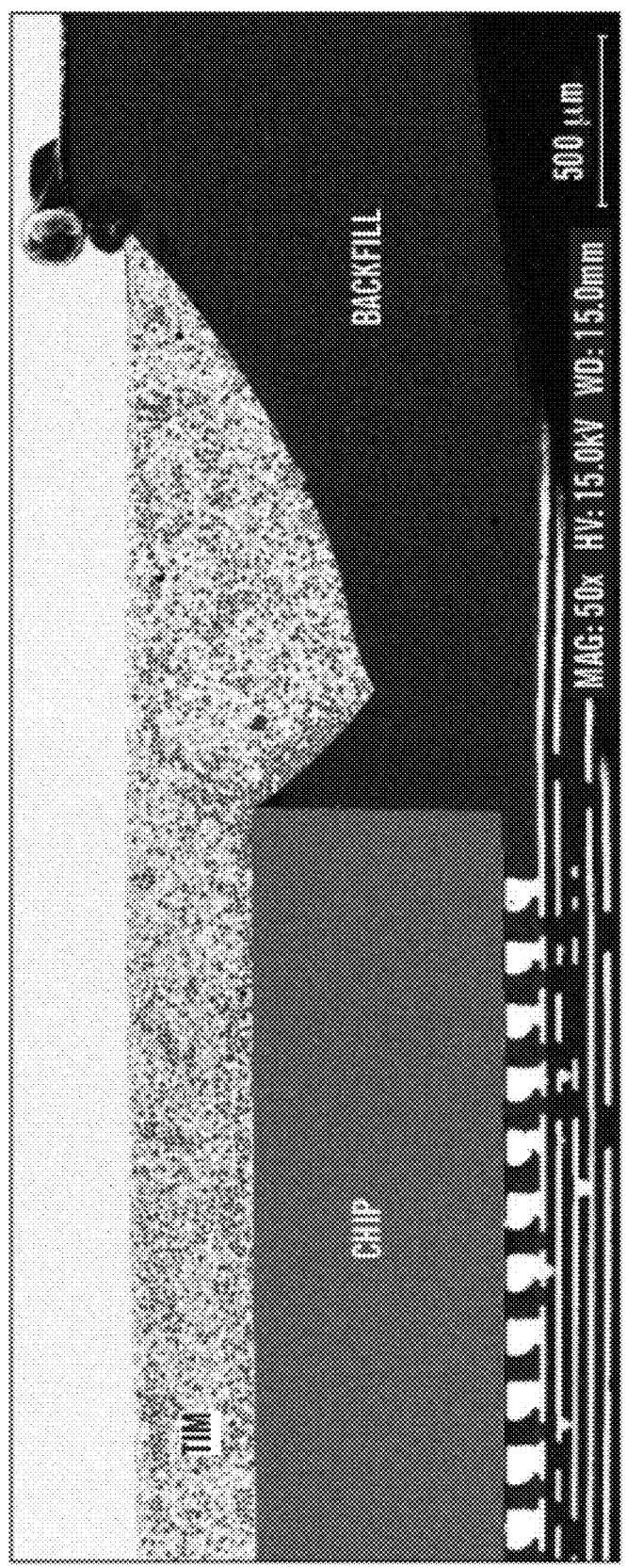
FIG. 4A shows a cross-sectional view of a laminate chip carrier electronic package in accordance with an embodiment of the invention after accelerated thermal cycling (ATC) stress testing.
Figure 4B:
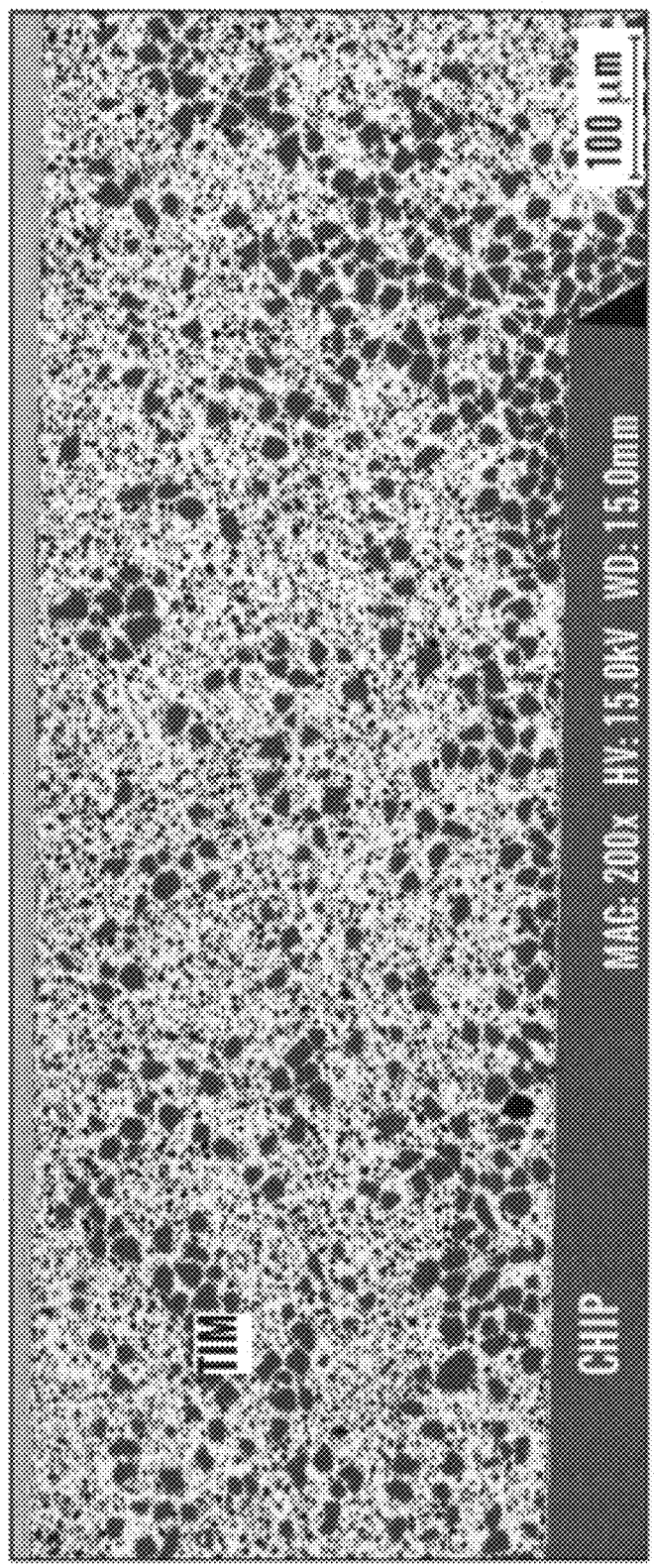
FIG. 4B is a higher magnification view of the electronic package of FIG. 4A.

FIG. 4A shows a cross-sectional view of a laminate chip-carrier electronic package after accelerated thermal cycling (ATC) stress testing. The electronic package underwent 1000 hours of 85 deg. C. at 85% RH and approximately 1200 ATC (0 deg. C.-100 deg. C.) thermal stress cycles. FIG. 4B is a higher magnification view of the electronic package of FIG. 4A. No edge TIM cracking is indicated.

Figure 5:
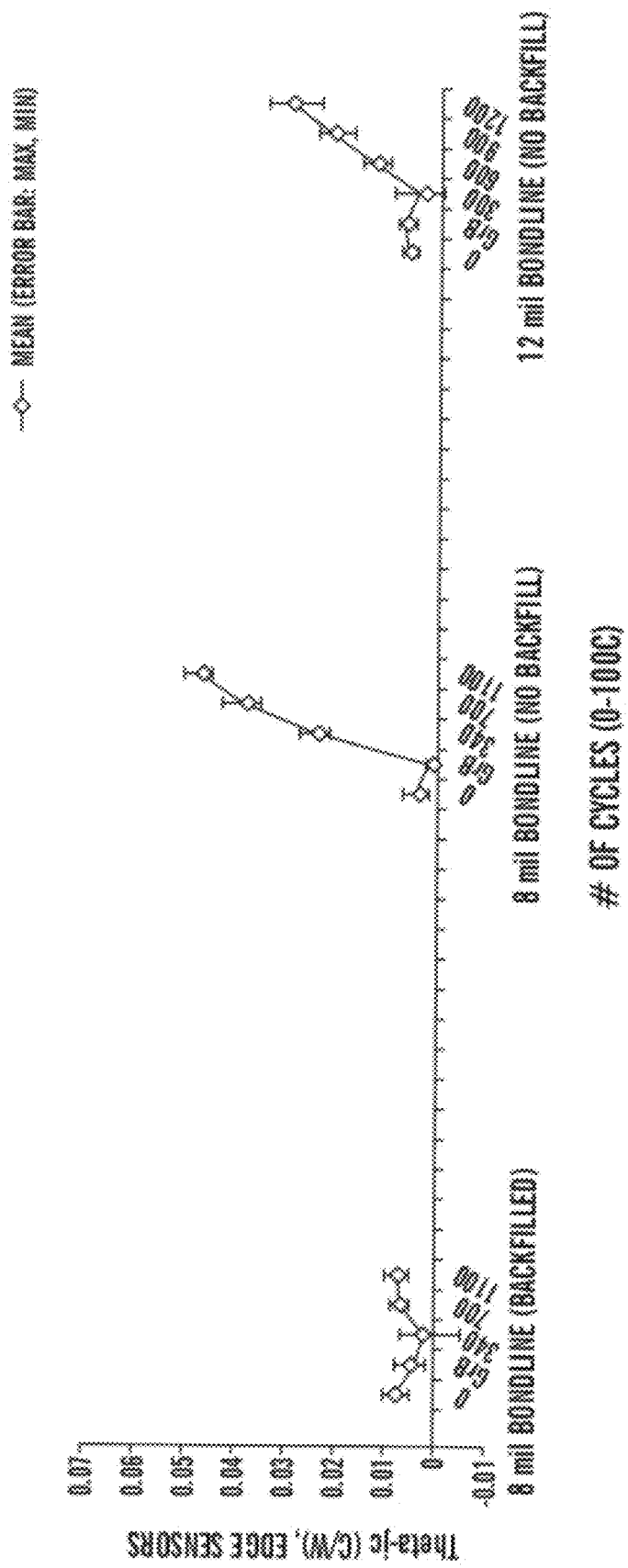
FIG. 5 is a plot of thermal resistance data as a function of ATC stress duration for a laminate chip carrier electronic package with solder TIM according to an embodiment of the invention and laminate chip carrier electronic packages with no backfill.

FIG. 5 is a plot of thermal resistance data as a function of ATC stress duration for a laminate chip-carrier electronic package with solder TIM according to an embodiment of the invention and laminate chip-carrier electronic packages with no backfill. The thermal resistance data are shown for edge sensors that track the thermal reliability performance close to the edges of the chip for thermal degradation. The first group of data represents an electronic package with backfill stressed to 1100 ATC (0 deg. C.-100 deg. C.) thermal stress cycles. No thermal degradation is observed. There is stable thermal performance. The subsequent sets of data represent electronic packages with no backfill. There is thermal degradation without the backfill. Thermal resistance increases at 8 and 12 mil bondline solder TIM without the backfill. The backfill mitigates thermal degradation and TIM solder cracking and improves reliability performance.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming an electronic package, comprising:
providing a chip having a frontside and a backside;
providing a chip carrier having a top surface and a bottom surface;
bonding the frontside of the chip to the top surface of the chip carrier;
dispensing a seal material at a periphery of the top surface of the chip carrier;
providing a lid;
providing a solder TIM having a first side and a second side, wherein the first side of the TIM contacts the backside of the chip and the second-side of the TIM contacts the lid;
performing a reflow to melt the TIM, wherein the first side of the TIM is bonded to the backside of the chip and the second side of the TIM is bonded to the lid;
curing the seal material, wherein the lid is attached to the top surface of the chip carrier;
injecting backfill material into a space between the top surface of the chip carrier and the lid, wherein the backfill material abuts sides of the TIM and fills the space; and
curing the backfill material.

2. The method according to claim 1, wherein the injecting step comprises injecting the backfill material through fill and vent holes in the lid.

3. The method according to claim 1, wherein the injecting step comprises injecting the backfill material through a gap in the seal material.

4. The method according to claim 1, wherein the lid includes a pedestal and the second side of the TIM is bonded to the pedestal.

5. The method according to claim 1, wherein the chip carrier is an organic laminate.

6. The method according to claim 1, wherein the chip carrier is a multi-layer ceramic substrate.

7. The method according to claim 1, wherein the seal is selected from the group consisting of: silicone elastomer adhesive, epoxy adhesive, modified epoxy and modified silicone adhesive.

8. The method according to claim 1, wherein the backfill material is a resin.

9. The method according to claim 1, wherein the TIM is In.

10. A method of forming an electronic package, comprising:
providing a chip having a frontside and a backside;
providing a chip carrier having a top surface and a bottom surface;
bonding the frontside of the chip to the top surface of the chip carrier;
dispensing a seal material at a periphery of the top surface of the chip carrier;
providing a lid having at least one fill hole and at least one vent hole;
providing a TIM having a first side and a second side, wherein the first side of the TIM contacts the backside of the chip and the second side of the TIM contacts the lid;
performing a solder reflow to melt the TIM, wherein the first side of the TIM is bonded to the chip and the second side of the TIM is bonded to the lid;
injecting backfill material through the fill hole and the vent hole, wherein the backfill material abuts sides of the TIM and fills a cavity between the chip carrier and the lid; and
curing the seal material and the backfill material simultaneously, wherein the lid is bonded to the top surface of the chip carrier.

11. The method according to claim 10, wherein the backfill material is selected from the group consisting of: epoxy, modified epoxy, modified silicone or a polyimide.

12. The method according to claim 11, wherein the backfill material has a modulus in the range from about 1 GPa to 20 GPa.

13. The method according to claim 10, wherein the TIM is selected from the group consisting of: In, In—Ag alloy, In—Sn alloy, Bi and its alloys, Sn—Ag—Cu (SAC) lead-free solder and high thermal conductivity material.

14. The method according to claim 13, wherein the TIM has a thickness from about 1 mil to 20 mil.

15. An electronic package, comprising:
a chip having a frontside and a backside;
a chip carrier having a top surface and a bottom surface, wherein the frontside of the chip is bonded to the top surface of the chip carrier;
a lid;
a TIM having a first side and a second side, wherein the first side of the TIM is in contact with the backside of the chip, the second side of the TIM is bonded to the lid and the lid is attached to the top surface of the chip carrier at a periphery with a seal; and
backfill material in a space between the top surface of the chip carrier and the lid, wherein the backfill material abuts sides of the TIM, wherein the backside of the chip includes a Cr/Ni/Au multilayer stack.

16. The electronic package according to claim 15, wherein the lid includes at least one fill hole.

17. The electronic package according to claim 15, wherein the multilayer stack is Ti/NiV/Au.

18. The electronic package according to claim 16, wherein the lid also includes at least one vent hole.

19. The electronic package according to claim 18, wherein the fill hole and the vent hole are diagonally across from each other.

20. The electronic package according to claim 18, wherein the fill hole and the vent hole are adjacent to each other.

21. The electronic package according to claim 18, wherein the fill hole and the vent hole are on opposite sides.

22. The electronic package according to claim 15, wherein the backfill material is a resin.

23. The electronic package according to claim 15, wherein the backfill material is selected from the group consisting of: epoxy, modified epoxy, silicone and modified silicone.

24. The electronic package according to claim 23, wherein the backfill material has a modulus in the range from about 1 GPa to 20 GPa.

* * * * *